United States Patent [19]

Shepherd et al.

[11] Patent Number: 5,185,502
[45] Date of Patent: Feb. 9, 1993

[54] HIGH POWER, HIGH DENSITY INTERCONNECT APPARATUS FOR INTEGRATED CIRCUITS

[75] Inventors: Lloyd T. Shepherd, Eau Claire; Melvin C. August, Chippewa Falls; James N. Kruchowski, Eau Claire, all of Wis.

[73] Assignee: Cray Research, Inc., Eagan, Minn.

[21] Appl. No.: 598,103

[22] Filed: Oct. 16, 1990

Related U.S. Application Data

[62] Division of Ser. No. 444,747, Dec. 1, 1989.

[51] Int. Cl.⁵ .............................................. H05K 1/00
[52] U.S. Cl. .................................. 174/262; 361/412; 361/414
[58] Field of Search ............... 174/262, 264, 255, 260, 174/250; 361/407, 408, 412, 414, 417, 410; 428/901; 29/830, 846, 851, 852

[56] References Cited

U.S. PATENT DOCUMENTS

| | | |
|---|---|---|
| 2,943,956 | 7/1960 | Robinson . |
| 3,006,819 | 10/1961 | Wilson et al. . |
| 3,115,423 | 12/1963 | Ashworth . |
| 3,240,602 | 3/1966 | Johnston . |
| 3,244,581 | 4/1966 | Miller . |
| 3,288,639 | 11/1966 | Smith, Jr. . |
| 3,330,695 | 7/1967 | Curran . |
| 3,423,205 | 1/1969 | Skaggs et al. . |
| 3,430,104 | 2/1969 | Burgess et al. . |
| 3,436,327 | 4/1969 | Shockley . |
| 3,487,522 | 1/1970 | Harendza-Harinxma . |
| 3,585,010 | 6/1971 | Luce et al. . |
| 3,691,007 | 9/1972 | Pavlou . |
| 3,704,163 | 11/1972 | Limbough . |
| 3,808,576 | 4/1974 | Castonguay et al. . |
| 3,832,603 | 8/1974 | Cray et al. . |
| 3,904,934 | 9/1975 | Martin . |
| 4,030,190 | 6/1977 | Varker ............................. 174/264 |
| 4,190,474 | 2/1980 | Berdan et al. . |
| 4,374,457 | 2/1983 | Wiech, Jr. . |
| 4,498,122 | 2/1985 | Rainal ............................. 174/264 |
| 4,514,784 | 4/1985 | Williams et al. . |
| 4,685,033 | 8/1987 | Inoue . |
| 4,706,165 | 11/1987 | Takenaka et al. ............ 174/264 |
| 4,770,897 | 9/1988 | Wu . |
| 4,803,595 | 2/1989 | Kraus et al. .................. 174/262 |
| 4,816,323 | 3/1989 | Inoue . |
| 4,899,439 | 2/1990 | Potter et al. .................. 361/414 |
| 4,920,639 | 5/1990 | Yee ................................ 174/261 |
| 5,072,075 | 12/1991 | Lee et al. ...................... 174/264 |

FOREIGN PATENT DOCUMENTS

| | | |
|---|---|---|
| 0083405 | 7/1983 | European Pat. Off. . |
| 0176245 | 3/1986 | European Pat. Off. . |
| 2558643 | 7/1985 | France . |

OTHER PUBLICATIONS

Jarvela, R. A. and J. J. Jebrani, *Wirability Enhancement*, IBM Disclosure, vol. 21, No. 9, Feb. 1979, p. 3624.
Proceedings of the IEEE 1988 National Aerospace and Electronics Conference (NAECON 1988), Dayton, May 23-27, 1988, vol. 1 of 4, IEEE D.C. Blazej et al.: "Enabling Technologies for Achieving Avionics Modularization".

Primary Examiner—Gerald P. Tolin
Assistant Examiner—Trinidad Korka
Attorney, Agent, or Firm—Merchant, Gould, Smith, Edell, Welter & Schmidt

[57] ABSTRACT

The present invention provides an improved method for manufacturing circuit boards with high power, high density interconnects. Printed circuit board technology, integrated circuit technology, and heavy-build electroless plating are combined to produce multilayer circuit boards comprised of substrates with different interconnect densities. In the higher density substrates, thick metallized layers are built-up by combining additive and subtractive techniques. These thicker foils minimize DC voltage drop so that conductors can run for longer distances. The conductors are substantially more square than their thin film equivalents, thus providing better performance for high frequency signals. Power distribution capabilities are enhanced by the present invention, so that circuit boards fully populated with dense, high-speed, high-power integrated circuits can easily be supplied with their necessary power requirements.

2 Claims, 5 Drawing Sheets

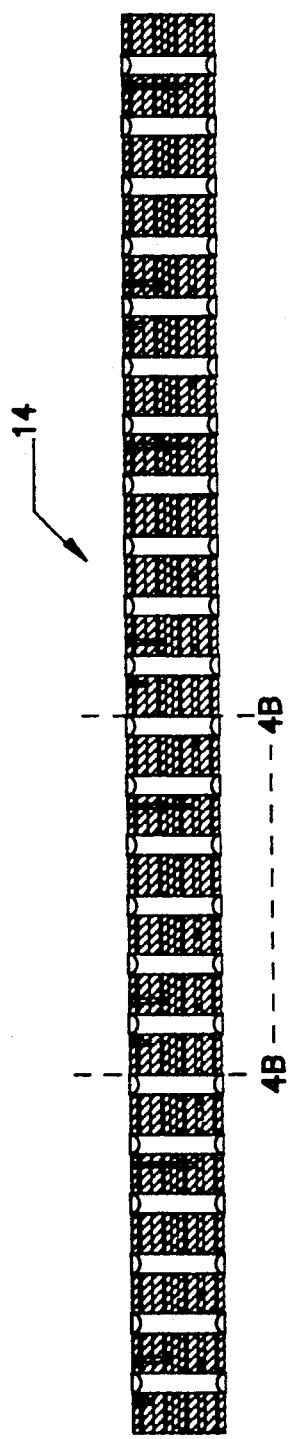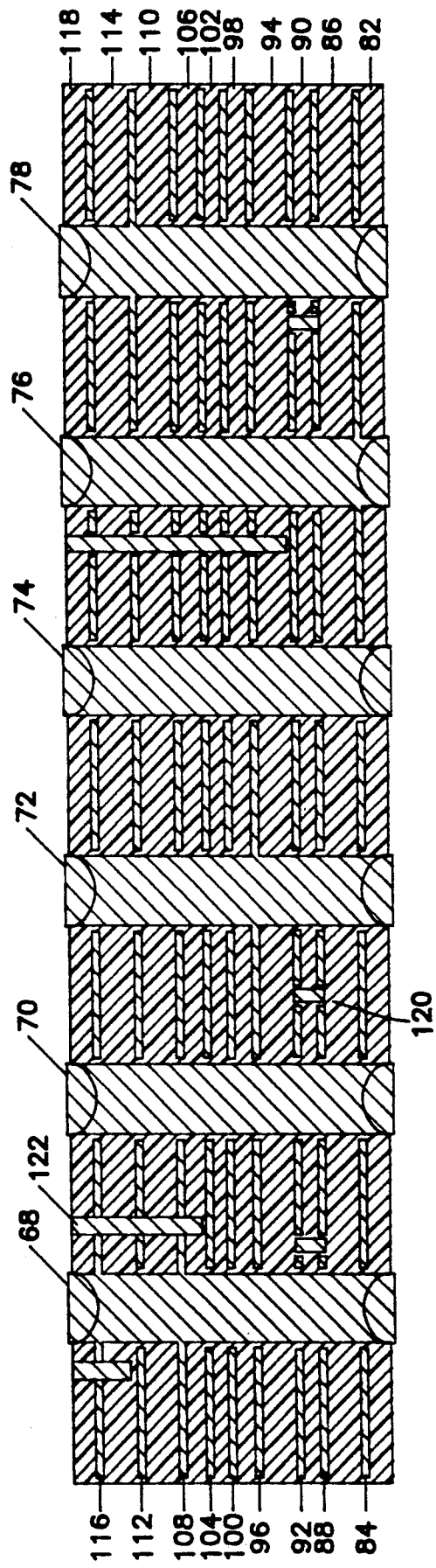
FIG. 4A
FIG. 4B

5,185,502

HIGH POWER, HIGH DENSITY INTERCONNECT APPARATUS FOR INTEGRATED CIRCUITS

This is a division of application Ser. No. 07/444,747, filed Dec. 1, 1989.

FIELD OF THE INVENTION

This invention relates generally to an integrated circuit interconnect method and apparatus.

BACKGROUND OF THE INVENTION

There is a need in the art for high power, high density interconnects for integrated circuits. Current generations of supercomputers, such as those built by Cray Research, Inc., the Assignee of the present invention, use integrated circuits that are very fast, very dense, and require large quantities of power. Such integrated circuits often contain hundreds of I/O connections, and as a result, their carriers have extremely tight lead spacing that allows little room on printed circuit boards for crossovers and interconnections. In addition, as clock speeds increase, the length of electrical interconnects must become shorter.

In the prior art, integrated circuits are typically mounted on single or double sided and multi-layer printed circuit boards. Multi-layer boards normally include ground planes interspersed between the signal layers to minimize noise and to provide a controlled impedance of the signal lines. However, prior art manufacturing techniques for printed circuit boards do not provide ideal solutions to the problems of lead spacing, line widths, impedance control, etc., required for dense, high-speed, high-power integrated circuits.

Standard printed circuit board technologies suffer from several disadvantages. Vias are typically drilled through the printed circuit boards and thus cannot be constructed with the appropriate sizes. In addition, it is difficult to start and end drilled vias at the correct spot.

Thin film technologies also suffer from several disadvantages. Thin film cannot provide the necessary metallization thickness needed for dense, high-speed, high-power integrated circuits. Thin film metallization also suffers from unacceptable DC voltage drops when extended over a distance.

SUMMARY OF THE INVENTION

To overcome limitations in the prior art described above and to overcome other limitations that will become apparent upon reading and understanding the present specification, the present invention provides an improved method for manufacturing circuit boards with high power, high density interconnects. Printed circuit board technology, integrated circuit technology, and heavy-build electroless plating are combined to produce multilayer circuit boards comprised of substrates with different interconnect densities. In the higher density substrates, thick metallized layers are built-up by combining additive and subtractive techniques. These thicker foils minimize DC voltage drop so that conductors can run for longer distances. The conductors are substantially more square than their thin film equivalents, thus providing better performance for high frequency signals. Power distribution capabilities are enhanced so that circuit boards fully populated with dense, high-speed, high-power integrated circuits can easily be supplied with their necessary power requirements.

DESCRIPTION OF THE DRAWINGS

In the drawings, where like numerals refer to like elements throughout the several views.

FIG. 4A is a cross-sectional side view of the low-density interconnect substrate;

FIG. 4B is a magnified view of a portion of the low-density interconnect substrate taken along lines 4B—4B of FIG. 4A;

DETAILED DESCRIPTION OF THE PREFERRED EMBODIMENT

In the following detailed description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

The present invention discloses an improved circuit board and interconnect method for integrated circuits thereon. The present invention combines printed circuit and integrated circuit processing technologies to fabricate the circuit boards. In addition, the present invention provides a method for creating thicker dielectric and metallization layers than normally encountered in integrated circuit processing technologies.

Figure 1A:
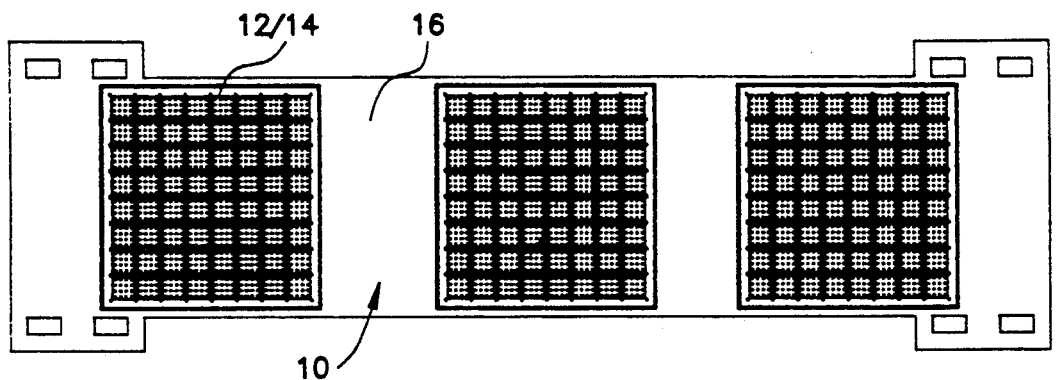
FIG. 1A is a top view of a module assembly according to the present invention.
Figure 1B:
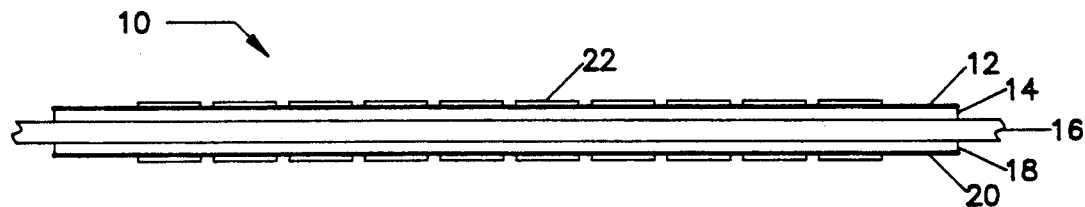
FIG. 1B is a side view of a module assembly according to the present invention.

FIG. 1A is a top view and FIG. 1B is a side view of a module assembly 10 according to the present invention. The module assembly 10 is comprised of a substrate power bus (SPB) 16 upon which is mounted a low-density interconnect (LDI) substrate 14 using a surface reflow solder, or other suitable techniques. A high-density interconnect (HDI) substrate 12 is built-up on the LDI substrate 14, using lamination, integrated circuit processing, and electroless plating technologies. Integrated circuit (IC) die 22 are directly bonded to the HDI substrate 12 using flip-tab, flip-chip, or other suitable bonding techniques. Both sides of the module assembly 10 support this HDI/LDI/SPB configuration as illustrated by LDI substrate 18 and HDI substrate 20 in FIG. 1B. The entire module assembly 10 may be immersed in a suitable liquid for cooling. Those skilled in the art will recognize that other cooling techniques could be substituted for the immersion technique.

Figure 2A:
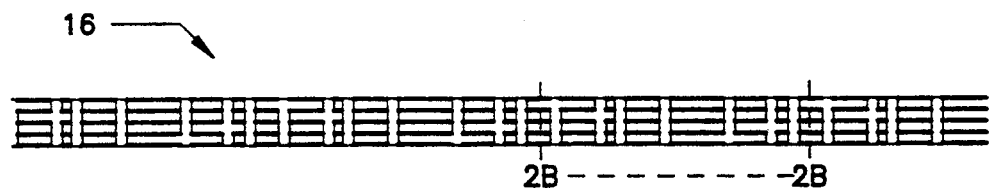
FIG. 2A is a cross-sectional side view of the substrate power bus.

FIG. 2A is a cross-sectional side view of the SPB 16. The SPB 16 is comprised of thick copper layers laminated to dielectric layers. These copper layers enhance the current carrying capability of the assembly module 10. The copper layers are typically machined, although other manufacturing techniques could be used.

Figure 2B:
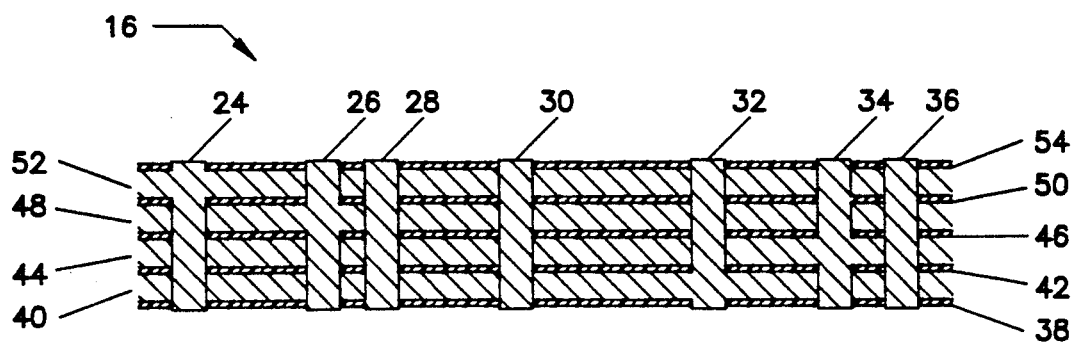
FIG. 2B is a magnified view of a portion of the substrate power bus taken along lines 2B—2B of FIG. 2A.

FIG. 2B is a magnified view of a portion of the SPB 16 taken along lines 2B—2B of FIG. 2A. Beginning at the top of the SPB 16 in FIG. 2B, a number of through vias are shown: ground 24, −5.0 volt power 26, signal 28, signal 30, −3.3 volt power 32, −2.0 volt power 34, and signal 36. The power vias 26, 28, 32, and 34 eliminate the need for large power bonding pads and traces on the surface of the module assembly 10. The signal vias 28 and 30 permit the interconnection of integrated circuits on both sides of the module assembly 10.

Beginning at the bottom of FIG. 2B, a number of dielectric and metal layers are shown: a 5 mil thick dielectric layer 38, a 25 mil thick copper layer 40 which is a −3.3 volt power plane, a 5 mil thick dielectric layer 42, a 25 mil thick copper layer 44 which is a −2.0 volt power plane, a 5 mil thick dielectric layer 46, a 25 mil thick copper layer 48 which is a −5.0 volt power plane, a 5 mil thick dielectric layer 50, a 25 mil thick copper layer 52 which is a ground plane, and finally, a 5 mil thick dielectric layer 54.

Figure 3A:
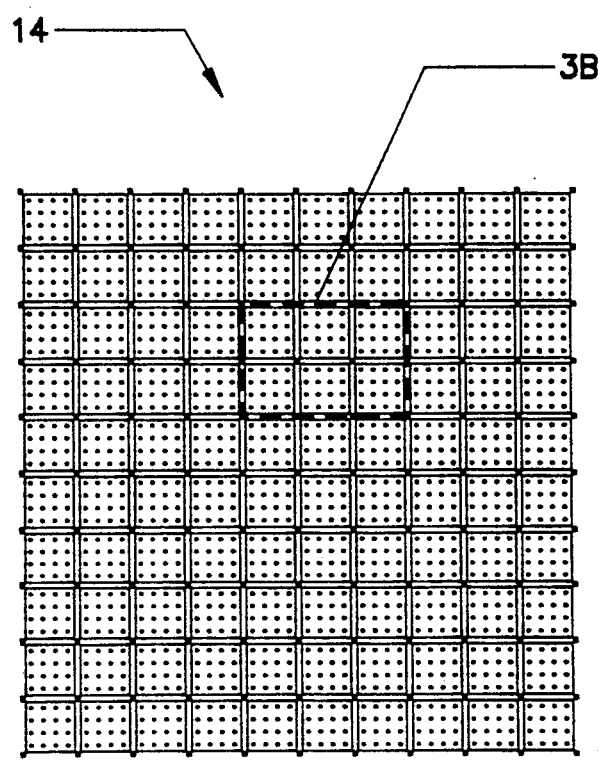
FIG. 3A is a top view of the low-density interconnect substrate.
Figure 3B:
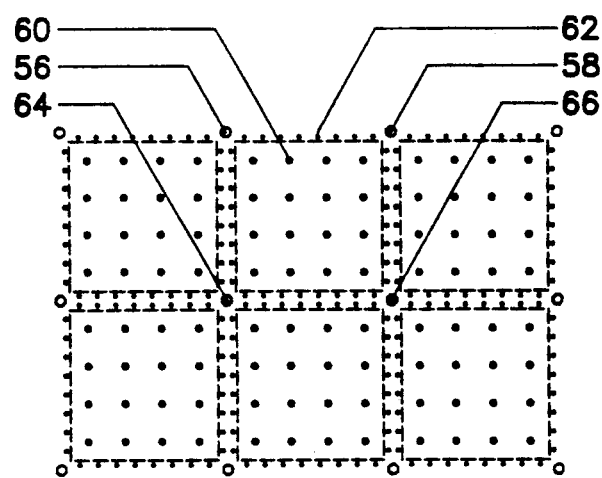
FIG. 3B is a magnified view of a portion of the low-density interconnect substrate taken along lines 3B—3B of FIG. 3A.

FIG. 3A is a top view of the LDI substrate 14. FIG. 3B is a magnified view of a portion of the LDI substrate 14 taken along lines 3B—3B of FIG. 3A. Shown in FIG. 3B are the ground vias 56, power vias 58, signal vias 60, signal vias 62, power vias 64, and power vias 66. Those skilled in the art will recognize that this configuration of vias is provided for illustration only and that any combination of signal, ground, and power vias could be substituted therefor. Except for the solid via posts 56-66, standard printed circuit board technology could be used as a substitute for the LDI substrate 14.

FIG. 4A is a cross-sectional side view of the LDI substrate 14. FIG. 4B is a magnified view of a portion of the LDI substrate 14 taken along lines 4B—4B of FIG. 4A. Beginning at the top of FIG. 4B, a number of through vias are shown: ground 68, signal 70, power 72, signal 74, power 76, and clock 78. In addition, hidden vias 120 and blind vias 122 are shown within the LDI substrate 14. Those skilled in the art will recognize that this configuration of vias is provided for illustration only and that any combination of signal, ground, and power vias could be substituted therefor.

The LDI substrate 14 is comprised of thick dielectric layers laminated to thick copper layers. The layers may be as thick as eight mils. Beginning at the bottom of FIG. 4B, a number of dielectric and metallization layers are shown: a 5 mil thick dielectric layer 82, a 1.4 mil thick copper layer 84 which is a −2.0 volt power plane, a 8 mil thick dielectric layer 86, a 0.7 mil thick copper layer 88 which is a Y signal plane, a 4 mil thick dielectric layer 90, a 0.7 mil thick copper layer 92 which is a X signal plane, a 8 mil thick dielectric layer 94, a 1.4 mil thick copper layer 96 which is a −5.2 volt power plane, a 4 mil thick dielectric layer 98, a 0.7 mil thick copper layer 100 which is a Y signal plane, a 3 mil thick dielectric layer 102, a 0.7 mil thick copper layer 104 which is a X signal plane, a 4 mil thick dielectric layer 106, a 1.4 mil thick copper layer 108 which is a ground plane, a 8 mil thick dielectric layer 110, a 0.7 mil thick copper layer 112 which is a clock distribution plane, a 8 mil thick dielectric layer 114, a 1.4 mil thick copper layer 116 which is a ground plane, and finally, a 5 mil thick dielectric layer 118. Those skilled in the art will recognize that this configuration of layers is provided for illustration only and that any combination of signal, ground, power, and dielectric layers could be substituted therefor.

Figure 5:
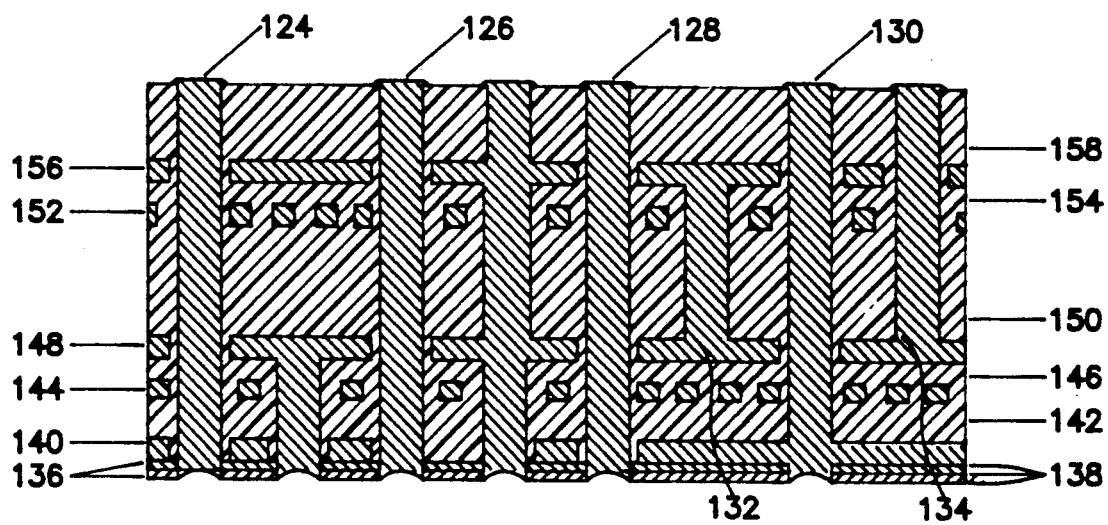
FIG. 5 is a cross-sectional side view of a first portion of the high-density interconnect substrate.

FIG. 5 is a cross-sectional side view of a first portion of a HDI substrate 12. In the present invention, techniques combining lamination, integrated circuit processing, and heavy-build electroless plating technologies are used to create the HDI substrate 12 on top of the LDI substrate 14.

While the use of integrated circuit processing techniques provide the needed line widths and resolution, trade-offs do occur. For example, six inches is a typical wafer size supported by integrated circuit processing equipment. Thus, the size of the LDI substrate 14 and the HDI substrate 12 in the present invention may be restricted to current wafer sizes. Alternatively, custom equipment may be obtained to support different wafer sizes or different geometries.

The HDI substrate 12 includes structures for the performance of several functions. Controlled impedance transmission lines provide interconnections between the ICs. Decoupling capacitors provide for the reduction of noise. Resistors provide for the termination of the transmission lines as needed.

Beginning at the top of FIG. 5, a number of through vias in the HDI substrate 12 are shown: −2.0 volt 124, ground 126, −5.2 volt 128, and −3.3 volt 130. In addition, hidden vias 132 and blind vias 134 are shown within the HDI substrate 12. Those skilled in the art will recognize that this configuration of vias is provided for illustration only and that any combination of signal, ground, and power vias could be substituted therefor.

Beginning at the bottom of FIG. 5, a number of layers make up the HDI substrate 12. First, a ground plane 136 is sputtered onto the LDI substrate 14. The ground plane 136 is a 3 micron thick layer of aluminum. A −3.3 volt power plane 140 is adjacent the ground plane 136 and separated therefrom by a 0.1 micron aluminum oxide layer 138. The −3.3 volt power plane 140 is a 20 micron thick layer of copper. The aluminum oxide layer 138 is produced by selectively anodizing the aluminum ground plane 136.

The next series of layers in FIG. 5 illustrate the signal interconnects. Signal planes, which are preferably 20 microns thick, are shown in layers 144, 148, 152, and 156. These signal planes 144, 148, 152 and 156 are interspersed among dielectric layers 142, 146, 150, 154, and 158, that preferably range in thickness from 20 to 40 microns.

A 60 ohm impedance is desired in the HDI substrate 12, thus, signal trace and plane spacing are controlled, depending on the dielectric constant, to provide this impedance. Those skilled in the art will recognize that alternative impedances could be similarly provided with alternative dielectric spacing or alternative signal trace widths.

Layers 144 and 152 support Y signal traces. Layers 148 and 156 support X signal traces. Those skilled in the art will recognize that any number or combination of layers may be used. In addition, power and ground planes may be interspersed at any level.

Also, in the preferred embodiment, the cross-sectional diameter of the X or Y signal traces is preferably 0.8 mils×0.8 mils. Those skilled in the art will recognize that other dimensions may be used.

Figure 6:
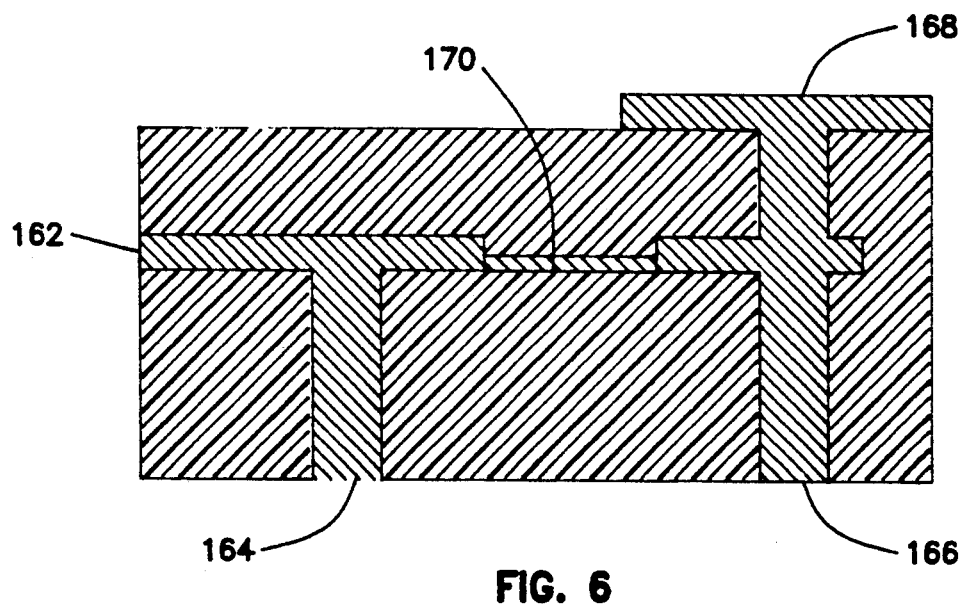
FIG. 6 is a cross-sectional side view of a second portion of the high-density interconnect substrate illustrating terminating resistors.

FIG. 6 is a magnified view of a second portion of the HDI substrate 12. Shown in FIG. 6 are a −2.0 volt plane 162, power via 164, and a nichrome termination resistor 170 connecting with a signal via 166. A pad 168 is deposited at the top of the signal via 166.

Figure 7:
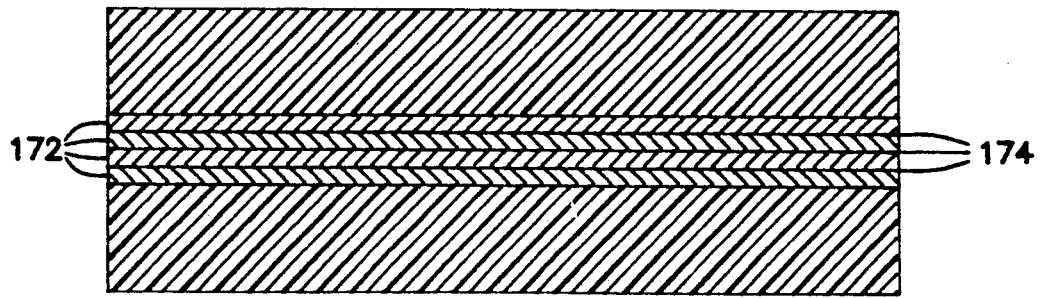
FIG. 7 is a cross-sectional side view of a third portion of the high-density interconnect substrate illustrating decoupling capacitors.

FIG. 7 is a magnified view of a third portion of the HDI substrate 12. Shown in FIG. 7 are a plurality of aluminum capacitor plates 172 separated by 0.1 micron aluminum oxide layers 174. The aluminum oxide is produced by selectively anodizing the aluminum capacitor plates 174. These elements create a decoupling capacitor.

Figure 8:
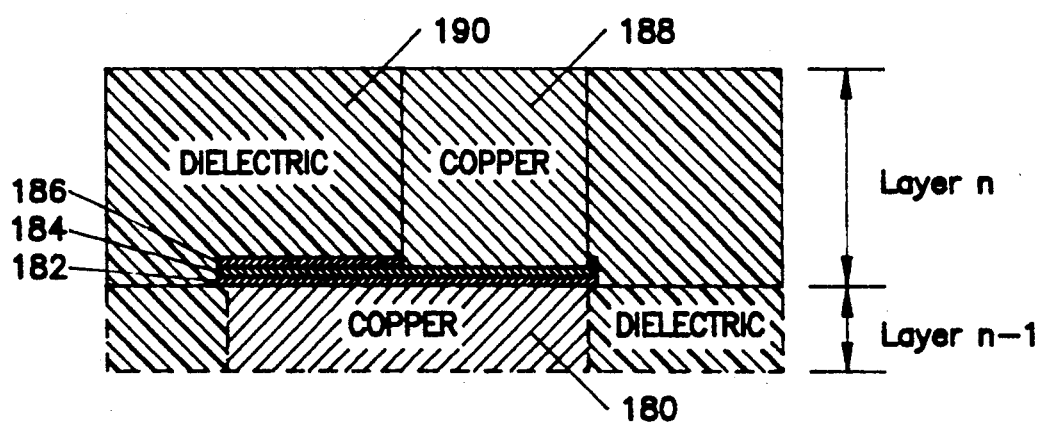
FIG. 8 is a cross-sectional side view describing how a layer is built in the high-density interconnect substrate.

FIG. 8 is a cross-sectional side view of a HDI substrate 12 layer, describing how the layer is built. Approximately 500-1000 angstroms of chromium 182 are sputtered onto the underlying copper layer 180. The chromium 182 provides for adhesion to the copper layer 180 underneath. Approximately 500-1000 angstroms of palladium 184 are sputtered onto the chromium 182. The palladium 184 provides a catalyst for the subsequent plating process. Approximately 500-1000 angstroms of chromium 186 are sputtered onto the palladium 184. The chromium 186 provides adhesion for the dielectric 190 deposited on it. Photoresist is applied, and the chromium 182, palladium 184, and chromium 186 are patterned and etched. Any copper from the underlying layer 180 is preferably covered. At the same time, a base is preferably formed for the subsequent deposition of copper 188. A layer of dielectric 190 is then applied. The preferred approach is to use vacuum lamination to apply the dielectric 190. Vacuum lamination requires that the substrate is placed into a vessel chamber, which is then evacuated. A platen in the vessel is heated. The dielectric layer 190, comprising a film of the desired thickness, is lowered onto the substrate and applied thereto. Pressure and temperature force the dielectric layer 190 to conform to the substrate and bond thereto. A hard mask and photoresist are applied and the dielectric 190 is patterned and plasma-etched using chromium as an etch stop. The chromium 186 is then etched from the substrate exposing the palladium 184. Heavy-build electroless plating is used to deposit the copper 188 onto the palladium 184 catalyst filling the trench in the dielectric 190.

Both the resistor and capacitor technology illustrated hereinbefore in FIGS. 6 and 7, are preferably incorporated with the heavy-build electroless plating method described in FIG. 8. Thus, the signal interconnects are built up layer-by-layer, with the traces, vias, terminating resistors, and decoupling capacitors all being implemented in the same process.

As illustrated, the present invention discloses an improved circuit board and method for manufacturing the same. A variety of technologies are used to fabricate the multiple density layers, electrical interconnects, decoupling capacitors, and termination resistors. The resulting circuit board provides an improved method of power distribution for integrated circuits.

Although a specific embodiment has been illustrated and described herein, it will be appreciated by those of ordinary skill in the art than any arrangement that is calculated to achieve the same purpose may be substituted for the specific embodiment shown. Those skilled in the art will recognize that the configurations of vias and layers provided herein are for illustration only and that similar combinations could be substituted therefor. Those skilled in the art will also recognize that alternative dimensions could be substituted for the specific dimensions described herein. In addition, different processing steps and different electrical connection patterns than those disclosed herein can be used. This application is intended to cover any adaptations or variations of the present invention. Therefore, it is manifestly intended that this invention be limited only by the claims in equivalence thereof.

What is claimed is:

1. A multilayer circuit board apparatus having a plurality of layers with differing interconnect densities to efficiently distribute ground voltage, electrical power and electrical signals throughout said circuit board apparatus to devices located on the surfaces of said circuit board apparatus, said apparatus comprising:

a) a substrate power bus layer having a first interconnect density, said substrate power bus layer further comprising a plurality of substrate copper layers interleaved with a plurality of dielectric layers, said substrate copper and dielectric layers forming a distribution network of ground voltage and electrical power at different voltage levels using selectively placed vias to distribute said ground voltages and electrical power to each of two major surfaces of said substrate power bus layer;

b) at least one low density interconnect substrate having a second interconnect density which is higher than said first interconnect density, each of said low density interconnect substrates being mechanically and electrically connected to each major surface of said substrate power bus layer, each low density interconnect substrate distributing electrical signals, ground voltage and electrical power at different voltage levels using selectively placed vias interconnecting a plurality of low density copper layers interleaved with a plurality of dielectric layers; and c) at least one high density interconnect substrate having a third interconnect density which is higher than said second interconnect density, each of said high density interconnect substrates being mechanically and electrically connected to each low density interconnect substrate, each high density interconnect substrate further distributing electrical signals, ground voltage and electrical power at different voltage levels using selectively placed vias interconnecting a plurality of conductive layers interleaved with a plurality of dielectric layers, each said high density substrate further having means for attaching integrated circuit die to said high density substrate.

2. The apparatus of claim 1, wherein said substrate copper layers of said substrate power bus sandwiched by said dielectric layers provide additional capacitance integral with said apparatus.

* * * * *